(12) United States Patent
Kim et al.

(10) Patent No.: US 10,840,370 B2
(45) Date of Patent: Nov. 17, 2020

(54) LATERAL DOUBLE DIFFUSED MOS TRANSISTOR

(71) Applicant: DB HITEK CO., LTD., Seoul (KR)

(72) Inventors: Jong Min Kim, Seoul (KR); Chul Jin Yoon, Suwon-si (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/265,510

(22) Filed: Feb. 1, 2019

(65) Prior Publication Data

US 2019/0245081 A1  Aug. 8, 2019

(30) Foreign Application Priority Data

Feb. 2, 2018 (KR) ........................ 10-2018-0013236

(51) Int. Cl.
*H01L 29/78* (2006.01)
*H01L 29/08* (2006.01)
*H01L 23/535* (2006.01)
*H01L 29/06* (2006.01)
*H01L 29/10* (2006.01)
*H01L 29/40* (2006.01)

(52) U.S. Cl.
CPC ........ *H01L 29/7823* (2013.01); *H01L 23/535* (2013.01); *H01L 29/063* (2013.01); *H01L 29/0696* (2013.01); *H01L 29/0865* (2013.01); *H01L 29/0869* (2013.01); *H01L 29/0882* (2013.01); *H01L 29/0886* (2013.01); *H01L 29/1095* (2013.01); *H01L 29/402* (2013.01); *H01L 29/404* (2013.01); *H01L 29/7831* (2013.01); *H01L 29/0878* (2013.01)

(58) Field of Classification Search
CPC combination set(s) only.
See application file for complete search history.

(56) References Cited

U.S. PATENT DOCUMENTS

| 2006/0261408 | A1* | 11/2006 | Khemka | H01L 29/063 257/335 |
| 2012/0292698 | A1* | 11/2012 | Moon | H01L 29/66659 257/344 |
| 2014/0124857 | A1* | 5/2014 | Jang | H01L 29/7816 257/337 |
| 2015/0187928 | A1* | 7/2015 | Wang | H01L 27/0727 257/337 |

* cited by examiner

*Primary Examiner* — Moin M Rahman
(74) *Attorney, Agent, or Firm* — Patterson Thuente Pedersen, P.A.

(57) ABSTRACT

A lateral double diffused MOS transistor includes a drain region positioned in a central region of an upper surface portion of an epitaxial layer, the drain region including a first well of a second conductive type, a source region positioned in the upper surface portion of the epitaxial layer and spaced apart from the drain region, the source region having a ring shape to surround the drain region and including a second well of the first conductive type, a first gate electrode disposed on the epitaxial layer and between the drain region and the source region, a P-sub region disposed on an upper surface of the epitaxial layer and laterally spaced apart from the source region, and a deep well of the second conductive type, disposed in the epitaxial layer, the deep well radially extending from the first well through the second well to entirely surround the drain region and the source region.

11 Claims, 4 Drawing Sheets

LATERAL DOUBLE DIFFUSED MOS TRANSISTOR

CROSS-REFERENCE TO RELATED APPLICATIONS

This application claims priority to Korean Patent Application No. 10-2018-0013236, filed on Feb. 2, 2018, and all the benefits accruing therefrom under 35 U.S.C. § 119, the contents of which are incorporated by reference in their entirety.

TECHNICAL FIELD

Embodiments of the present disclosure relate to a lateral double diffused MOS transistor. More particularly, embodiments disclosed herein relate to a low side lateral double diffused MOS transistor having a source voltage higher than a substrate voltage.

BACKGROUND

It is common that at least one high voltage device, including high voltage integrated circuits and low voltage integrate circuits placed on a chip, are widely used in various electrical applications. In integrated circuits, a so-called lateral double-diffused Metal Oxide Semiconductor (LDMOS) transistor is one such high voltage device.

It is well known that, in the practical design of the LDMOS transistor, it is basically required to minimize a low on-resistance while maintaining a high breakdown voltage. However, it is also well known that these two electrical parameters have a trade-off relation to each other in current process technology.

Recently, a reduced surface field (RESURF) technology has attracted attention for increasing the breakdown voltage while maintaining low on-resistance. According to the RESURF technology, a high breakdown voltage and a desired on-resistance can be simultaneously obtained by increasing a doping concentration of the epitaxial layer and reducing the thickness of the epitaxial layer.

For example, a LDMOS transistor includes a source region positioned in a central region of an epitaxial layer and having a sharp shape, a ring-shaped drain region adjacent to the source region, a P-sub region adjacent to the drain region, and a deep well having a ring shape to surround the drain region.

When the LDMOS transistor is connected to a low side element, the LDMOS transistor needs to have a source voltage higher than the voltage of the P-sub region. In order to achieve the requirement, the LDMOS transistor may not only require a relatively high breakdown voltage (BV) between the source region and the drain region, but also have a relatively high punch through voltage between the source region and the P-Sub region (BVsp).

However, a drain electric field may concentrate in the source region having the sharp shape to cause the breakdown voltage (BV) to drop. In order to compensate for this, the deep well may include a cut-off region at a position corresponding to both ends of the source region. However, when the deep well including the cut-off region is provided, the punch-through voltage (BVsp) may be reduced. Therefore, the breakdown voltage (BV) and the punch-through voltage (BVsp) have a trade-off relationship with each other.

Therefore, it is required to develop a LDMOS transistor capable of increasing both the breakdown voltage (BV) and the punch-through voltage (BVsp).

SUMMARY

The example embodiments of the present disclosure provide a lateral double diffused MOS transistor capable of having a relatively high breakdown voltage and a relatively high punch through voltage.

According to an example embodiment, a lateral double diffused MOS transistor includes a semiconductor substrate of a first conductivity type, an epitaxial layer of the first conductivity type, provided on the semiconductor substrate, a drain region positioned in a central region of an upper surface portion of the epitaxial layer, the drain region including a first well of a second conductive type and being connected to a drain electrode, a source region positioned in the upper surface portion of the epitaxial layer and spaced apart from the drain region, the source region having a ring shape to surround the drain region, including a second well of the first conductive type and being connected to at least one source electrode, a first gate electrode disposed on the epitaxial layer and between the drain region and the source region, the first gate electrode being partially overlapped with the source region, a P-sub region disposed on an upper surface of the epitaxial layer and laterally spaced apart from the source region, the P-sub region including a third well of the first conductive type and being connected to a P-sub electrode, and a deep well of the second conductive type, disposed in the epitaxial layer, the deep well radially extending from the first well through the second well to entirely surround the drain region and the source region.

In an example embodiment, the drain region may have a bar shape in a plan view.

In an example embodiment, the deep well may include an overlapped region being overlapped with the source region and the drain region, and an extension region extending from the second well toward to the P-sub region.

In an example embodiment, the lateral double diffused MOS transistor may further include a first metal wiring positioned over the first gate electrode, the first metal wiring being connected to the drain electrode and the P-sub electrode and a second metal wiring positioned over the first metal wiring, the second metal wiring being connected to the source electrode.

In an example embodiment, the first metal wiring may include a first Reduced Surface Field (RESURF) portion being overlapped with the first gate electrode and the second metal wiring in a plan view, the first RESURF portion being connected to the second metal wiring.

In an example embodiment, the lateral double diffused MOS transistor may further include a second gate electrode disposed on the epitaxial layer and between the source region and the P-sub region, the second gate electrode being partially overlapped with the source region.

In an example embodiment, the first metal wiring may further include a second RESURF portion being overlapped with the second gate electrode and the second metal wiring in a plan view, the second RESURF portion being connected to the second metal wiring.

In an example embodiment, a plurality of source electrodes may be arranged along the source region, and the deep well includes a plurality of cut-off regions disposed at positions to correspond to the source electrodes.

In an example embodiment, the deep well may have a lateral width measured from a side end of the second well larger than a vertical depth measured from a lower end of the second well.

In an example embodiment, the P-sub region may have a ring shape to entirely surround the source region.

In an example embodiment, the drain region may include a first high concentration region, the source region includes a second high concentration region, and the P-sub region includes a third high concentration region.

In an example embodiment, wherein the second high concentration region includes a first subsidiary high concentration impurity region and second and third subsidiary high concentration impurity region positioned at both side of the first subsidiary high concentration impurity region.

According to some embodiments of the present invention, the lateral double diffused MOS transistor includes the drain region having a bar shape and being positioned at the center portion of the epitaxial layer, and the source region having a ring shape to surround the drain region, so that a drain electric field concentration may be suppressed in the source region. Therefore, a breakdown voltage may be increased between the source region and the drain region.

Further, since the deep well extends from the source region to the P-sub region, the source region may be easily isolated from the P-sub region.

Furthermore, the first metal wiring includes the first RESURF portion being overlapped with the first gate electrode and the second metal wiring in a plan view and being connected with the second wiring, and the second RESURF portion being overlapped with the second gate electrode and the second metal wiring in a plan view and being connected with the second wiring When the drain bias applied to the drain region is larger than those of the source region and the P-sub region, a punch through voltage (BVsp) is generated in a region which is located under the source region and in the overlapped portion of the deep well. Thus, the punch through voltage may be applied to the extension portion included in the deep well. The first gate conductive layer and the first RESURF portion may alleviate the electric field concentration in a region located below the source region and in the overlapping portion. On the other hand, the electric field concentration generated by the voltage applied to the extension portion may be relaxed through the second gate electrode and the second RESURF portion. As a result, the punch through voltage between the P-sub region and the source region may be secured as much as the punch through voltage (BVsp) generated in the region located under the source region.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Subject matter hereof may be more completely understood in consideration of the following detailed description of various embodiments in connection with the accompanying figures.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
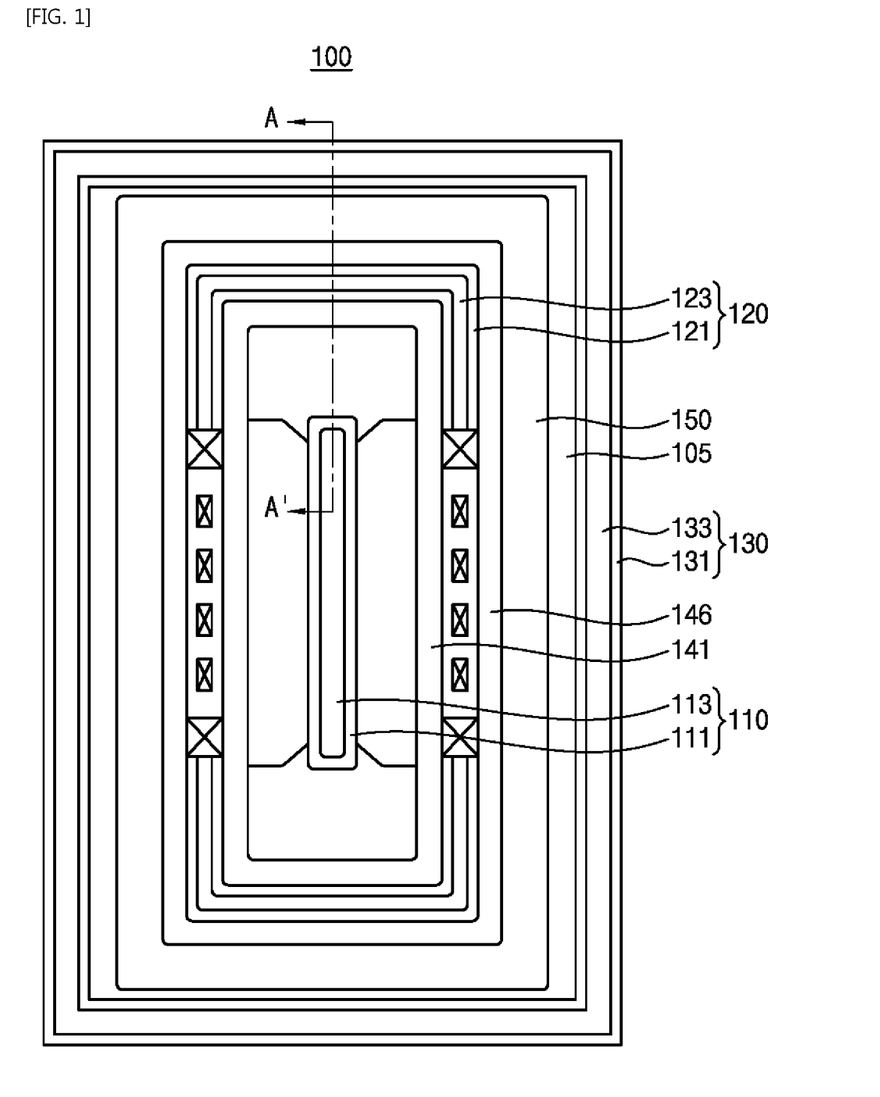
FIG. 1 is a plan view illustrating a lateral double diffused MOS transistor in accordance with an example embodiment of the present disclosure.
Figure 2:
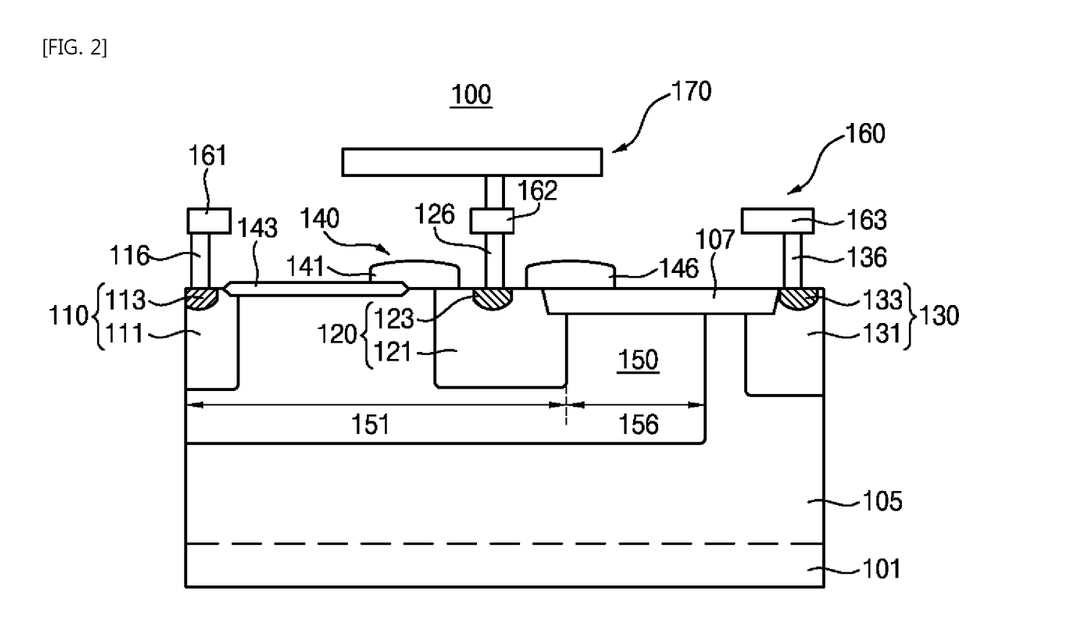
FIG. 2 is a cross sectional view taken along a line A-A' of FIG. 1.

FIG. 1 is a plan view illustrating a lateral double diffused MOS transistor in accordance with an example embodiment of the present invention. FIG. 2 is a cross sectional view taken along a line A-A' shown in FIG. 1.

Referring to FIGS. 1 and 2, according to an example embodiment of the present invention, a lateral double diffused MOS transistor include a semiconductor substrate 101, an epitaxial layer 105, a drain region 110, a source region 120, a first gate electrode 140 a P-sub region 130 and a deep well 150. The lateral double diffused MOS transistor 100 may correspond to a low side lateral double diffused MOS transistor having a source voltage higher than a substrate voltage.

The semiconductor substrate 101 includes a silicon substrate. The semiconductor substrate 101 may have a first conductive type. For example, the semiconductor substrate 101 may have a p-type conductivity with p-type dopants.

The epitaxial layer 105 is provided on the semiconductor substrate 101. The epitaxial layer 105 may be formed by growing from a surface of the semiconductor substrate 101 through an epitaxial growth process. Accordingly, the epitaxial layer 105 may have a crystal structure, a lattice constant and a crystal orientation substantially identical those of the semiconductor substrate 101. The epitaxial layer 105 has a first conductive type. For example, the epitaxial layer 105 can have a p-type conductivity.

Referring to FIGS. 1 and 2 again, the drain region 110 is provided in an upper surface portion of the epitaxial layer 105. The drain region 110 is positioned in a central region of the upper surface portion of the epitaxial layer 105. That is, the drain region 110 is not formed in a peripheral region surrounding the central region, whereas the drain region 110 is provided selectively in the central region.

The drain region 110 has a first well 111 having a second conductive type. That is, when the epitaxial layer 105 has a p-type conductivity, the first well 111 may have an n-type conductivity. The first well 111 is connected to a drain electrode 116.

The drain region 110 may further include a first high concentration region 113 at an upper portion of the first well 111. The first high concentration region 113 may further secure an electrical connection between the first well 111 and the drain electrode 116.

The drain region 110 may have a bar shape in a plan view. As a result, a drain electric field formed from the drain region 110 may be uniformly formed in a radial direction with respect to a center the drain region 110 to be uniformly applied to the source region 120.

The source region 120 is positioned at the upper surface portion of the epitaxial layer 105. The source region 120 is spaced apart from the drain region 110. The source region 120 may surround the drain region 110.

For example, the source region 120 can have a ring shape so as to surround the drain region 110 in a plan view. That is, the source region 120 does not have a sharp edge at corners thereof, different form a conventional source region. Accordingly, when the drain electric field is applied to the source region 120, the electric field is uniformly applied entirely across the source region 120, so that electric field concentration at a specific position may be suppressed.

The source region 120 includes a second well 121 having the first conductive type. For example, the second well 121 may have a p-type conductivity when the first well 111 has an n-type conductivity. The second well 121 is connected to a source electrode 126.

The source region 120 may further include a second high concentration region 123 on the second well 121. The second high concentration region 123 may securely connect electrically the second well 121 and the source electrode 126 to one another.

The second high concentration region 123 includes an first n-type subsidiary high concentration region (not shown), a second p-type subsidiary high concentration region (not shown) and a third n-type subsidiary high concentration region (not shown) which are arranged in a horizontal direction. Here, the second p-type subsidiary high concentration region is electrically connected to the source electrode 126.

The first gate electrode 140 is disposed on the epitaxial layer 105, that is, on an upper surface of the epitaxial layer 105. The first gate electrode 140 is provided between the drain region 110 and the source region 120. The first gate electrode 140 may be provided to be partially overlapped with the source region 120. The first gate electrode 140 includes a gate insulating layer 141 and a gate conductive layer 143.

Referring to FIGS. 1 and 2, the P-sub region 130 is provided on the upper surface portion of the epitaxial layer 105, and the P-sub region 130 is laterally spaced from the source region 120. That is, the P-sub region 130 may surround the source region 120 within the surface plane of the device 100. The P-sub region 130 may have a ring shape.

The P-sub region 130 may include a third well 131 and a third high concentration region 133.

The third well 191 is provided at a predetermined depth at the upper surface portion of the epitaxial layer 120. The third well 119 may include, for example, p-type conductive dopants, to have the first conductive type.

The third high concentration region 133 is formed by implanting high-concentration p-type impurities into a surface portion of the third well 131 to a predetermined depth. The third high concentration region 133 is connected to the P-Sub electrode 136.

The third well 131 has a ring structure and may be provided so as to surround the second well 121. Therefore, the third high concentration impurity region 133 may have the ring structure. Since the third high concentration impurity region 133 has a ring structure, the lateral double diffused MOS transistor 100 may operate with being independent from a parasitic operation of peripheral elements adjacent to the lateral double diffused MOS transistor 100. Therefore, the lateral dual diffused MOS transistor 100 may operate more stably.

The deep well 150 is provided in the epitaxial layer 105. Further, the deep well 150 extends from the first well 111 through the second well 121. Accordingly, the deep well 150 is formed to entirely surround the drain region 110 and the source region 120.

The deep well 150 may have the second conductive type, for example, an n-type conductivity. Also, the deep well 150 have a concentration lower than that of the second well 121.

The deep well 150 includes an overlapped portion 151 overlapping the source region 110 and the drain region 120, and an extension portion 156 extending in a horizontal direction from the second well 121 toward the P-sub region 156. Accordingly, the deep well 150 may easily electrically isolate the source region 120 and the P-sub region 130 from each other.

When a drain bias is greater than biases of the source region 120 and the P-sub region 130, a punch-through voltage (BVsp) may occur in a region of the overlapping region 151, which is located under the source region 120. At this time, the punch-through voltage may be applied to the extended portion 156 included in the deep well 150.

In a border region between the drain region 110 and the source region 120, the gate insulating layer 141 may alleviate electric field concentration to increase a breakdown voltage (BV) between the drain region 110 and the source region 120.

In an example embodiment of the present invention, the lateral double diffused double MOS transistor 100 may further include a first metal wiring 160 and a second metal wiring 170.

The first metal wiring 160 is provided over the first gate electrode 140. The first metal wiring 160 is connected to the drain electrode 116 and the P-sub electrode 136.

On the other hand, the second metal wiring 170 is provided over the first metal wiring 160. The second metal wiring 170 is connected to the source electrode 126.

In an example embodiment of the present invention, a lateral dual diffused MOS transistor 100 may further includes a second gate electrode 146 provided on the epitaxial layer 105. The second gate electrode 146 may be positioned between the source region 120 and a P-sub region 130 and may partially overlap with the source region 120.

The second gate electrode 146 may relieve an electric field concentration which occurs at either the extension portion 156 of the deep well 150, which is located between the source region 120 and the P-sub region 130 or the first metal wiring 160.

The deep well 150 may have a lateral width measured to a side end of the second well 121 that is greater than a vertical depth measured from a lower end of the second well 121. As the lateral width is adjusted, the punch-through voltage will change accordingly.

Figure 3:
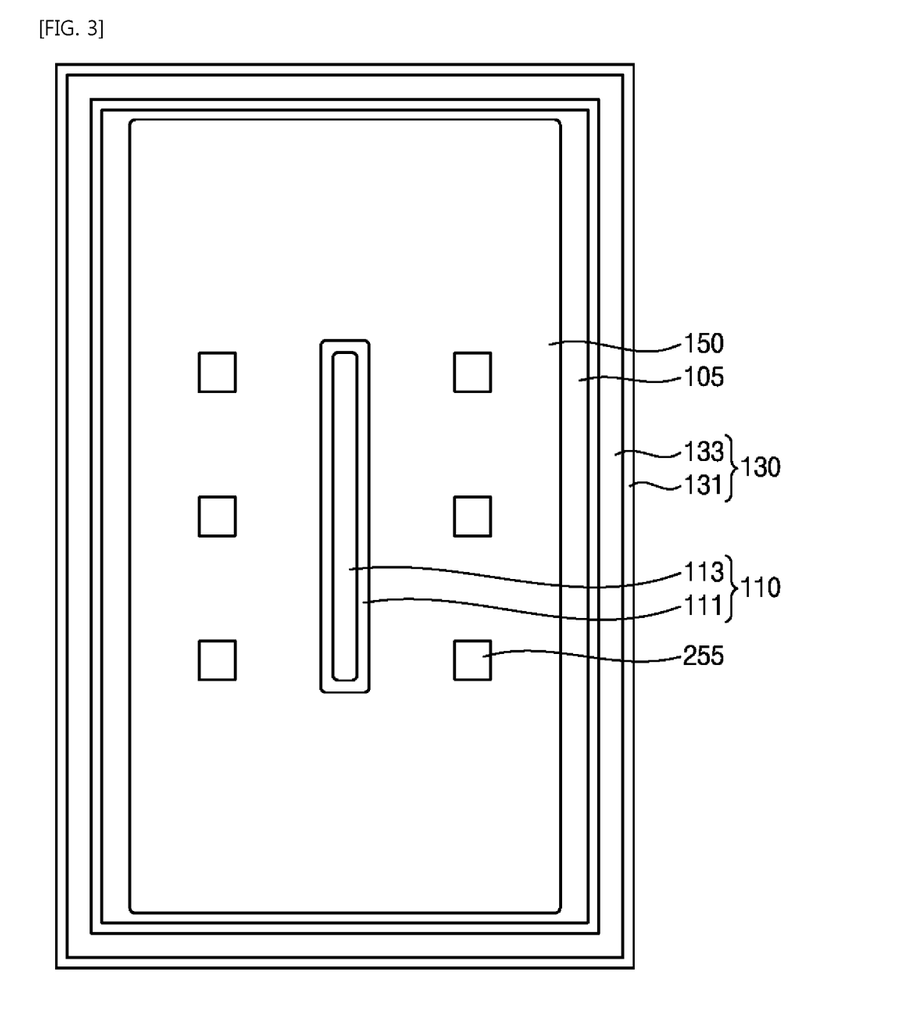
FIG. 3 is a plan view illustrating the drain region and the deep well as one example in FIG. 2.

FIG. 3 is a plan view illustrating the drain region and the deep well as one example in FIG. 2.

Referring to FIGS. 1 to 3, a plurality of the source electrodes 126 are arranged along the source region 120. In addition, the deep well 150 includes a plurality of cut-off regions 255 disposed at positions corresponding to those of the source electrodes 126.

Therefore, an electric field concentration in the source region 120 adjacent to the source electrodes 126 may be relieved owing to the cut-off regions 255 so that the breakdown voltage (BV) between the source region 120 and drain regions 110 included in the lateral double diffused MOS transistor 110 may be improved.

Figure 4:
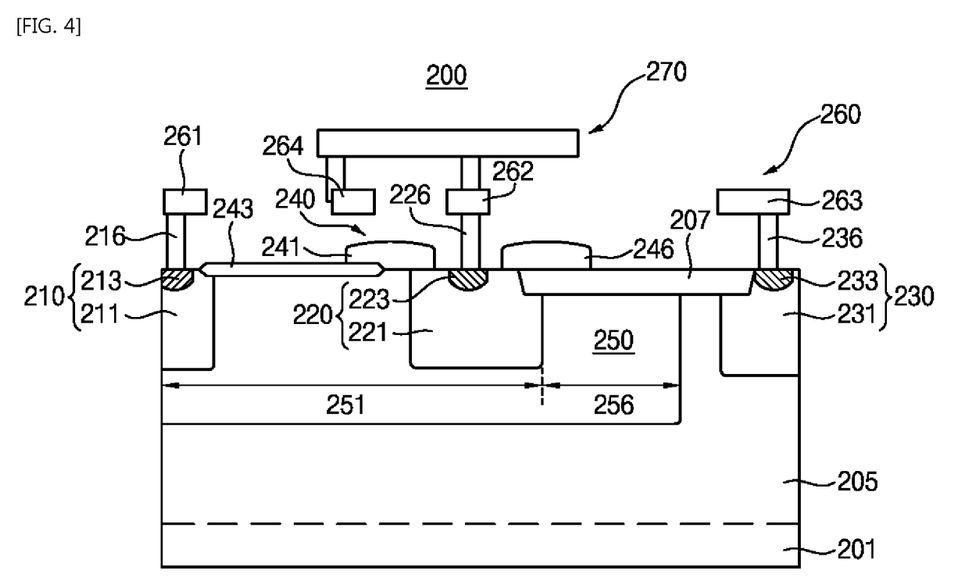
FIG. 4 is a cross sectional view illustrating a lateral double diffused MOS transistor in accordance with an example embodiment of the present disclosure.

FIG. 4 is a cross sectional view illustrating a lateral double diffused MOS transistor in accordance with an example embodiment of the present invention.

Referring to FIG. 4, a lateral double diffused MOS transistor 200 according to an embodiment of the present invention includes a semiconductor substrate 201, an epitaxial layer 205, a drain region 210, a source region 220, a gate electrode 240, a P-sub region 230 and a deep well 250.

The lateral double diffused MOS transistor 200 according to an embodiment of the present invention includes elements substantially identical to those of the lateral double diffused MOS transistor described in detail with reference to FIGS. 1 to 3 except for a first metal wiring 260. Therefore, a detailed description thereof will be omitted in order to avoid any redundancy.

The first metal wiring 260 further include a first RESURF portion 246 being overlapped with the first gate electrode 240 and a second metal wiring 270 in a plan view and being connected to the second metal wiring 270.

When the drain bias applied to the drain region 210 is greater than those applied to the source region 220 and the P-sub region 230, a punch through voltage (BVsp) may occur at an overlapped region 251 located below the source region 220. At this time, the punch through voltage may be applied to an extension portion 256 included in a deep well 250.

According to embodiments, a first gate conductive layer 241 and the first RESURF portion 264 may alleviate an electric field concentration in the overlapped portion 251 located below the source region 220. Meanwhile, an electric field generated by a voltage applied to an extension portion 256 may be relaxed owing to a second gate electrode 246.

Thus, the punch through voltage between the P-sub region 230 and the source region 220 may be ensured as much as the punch through voltage (BVsp) generated at the region located under the source region 220.

Figure 5:
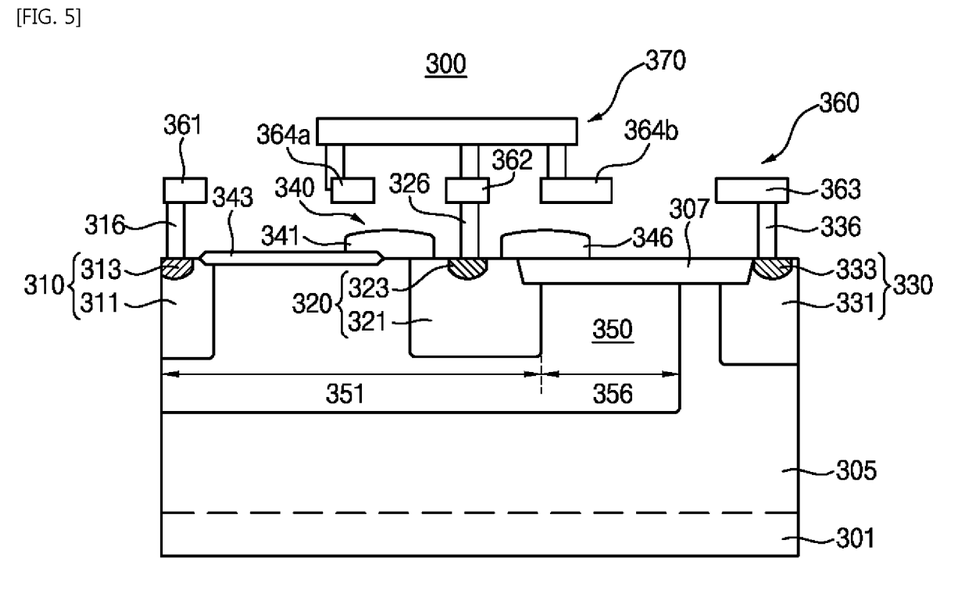
FIG. 5 is a cross sectional view illustrating a lateral double diffused MOS transistor in accordance with an example embodiment of the present disclosure.

FIG. 5 is a cross sectional view illustrating a lateral double diffused MOS transistor in accordance with an example embodiment of the present invention.

Referring to FIG. 5, a lateral double diffused MOS transistor 300 according to an embodiment of the present invention includes a semiconductor substrate 301, an epitaxial layer 305, a drain region 310, a source region 320, a gate electrode 340, a P-sub region 330 and a deep well 350.

The lateral double diffused MOS transistor 300 according to an embodiment of the present invention includes elements substantially identical to those of the lateral double diffused MOS transistor described in detail with reference to FIGS. 1 to 3 except for a first metal wiring 360. Therefore, a detailed description thereof will be omitted in order to avoid any redundancy.

The first metal wiring 360 includes a first RESURF portion 364a being overlapped with a first gate electrode 340 and a second metal wiring 370 in a plan view and being connected to the second metal wiring 370, and a second RESURF portion 364b being overlapped with a second gate electrode 346 and the second metal wiring 370 and being connected to the second metal wiring 370.

When the drain bias applied to the drain region 310 is greater than those applied to the source region 320 and the P-sub region 330, a punch through voltage (BVsp) may occur at an overlapped region 351 located below the source region 320. At this time, the punch through voltage may be applied to an extension portion 356 included in a deep well 350.

According to embodiments, a first gate conductive layer 341 and the first RESURF portion 264 may alleviate an electric field concentration in the overlapped portion 351 located below the source region 220. Meanwhile, an electric field generated by a voltage applied to an extension portion 256 may be relaxed owing to a second gate electrode 346 and the second RESURF portion 364b.

Thus, the punch through voltage between the P-sub region 330 and the source region 320 may be ensured as much as the punch through voltage (BVsp) generated at the region located under the source region 320.

Further, when the bias of the source region 320 is smaller than that of the P-sub region 330, the second RESURF portion 364b may function as a gate electrode.

As described above, when the lateral double-diffused MOS transistor according to the embodiments of the present invention is connected to the low-side element, the lateral double-diffused MOS transistor may have a source voltage higher than a voltage of the P-sub regions.

Although the lateral double diffused MOS transistors have been described with reference to the specific embodiments, they are not limited thereto. Therefore, it will be readily understood by those skilled in the art that various modifications and changes can be made thereto without departing from the spirit and scope of the appended claims.

It should be understood that the individual steps used in the methods of the present teachings may be performed in any order and/or simultaneously, as long as the teaching remains operable. Furthermore, it should be understood that the apparatus and methods of the present teachings can include any number, or all, of the described embodiments, as long as the teaching remains operable.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that embodiments may comprise fewer features than illustrated in any individual embodiment described above. The embodiments described herein are not meant to be an exhaustive presentation of the ways in which the various features may be combined. Accordingly, the embodiments are not mutually exclusive combinations of features; rather, embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Moreover, reference in the specification to "one embodiment," "an embodiment," or "some embodiments" means that a particular feature, structure, or characteristic, described in connection with the embodiment, is included in at least one embodiment of the teaching. The appearances of the phrase "in one embodiment" in various places in the specification are not necessarily all referring to the same embodiment.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of Section 112, sixth paragraph of 35 U.S.C. are not to be invoked unless the specific terms "means for" or "step for" are recited in a claim.

What is claimed is:

1. A lateral double diffused MOS transistor comprising:
a semiconductor substrate of a first conductivity type;
an epitaxial layer of the first conductivity type, provided on the semiconductor substrate;
a drain region positioned in a central region of an upper surface portion of the epitaxial layer, the drain region including a first well of a second conductive type and connected to a drain electrode;
a source region positioned in the upper surface portion of the epitaxial layer and spaced apart from the drain region, the source region having a ring shape to surround the drain region, the source region further including a second well of the first conductive type and connected to at least one source electrode;
a first gate electrode disposed on the epitaxial layer and between the drain region and the source region, the first gate electrode partially overlapping the source region;
a P-sub region disposed on an upper surface of the epitaxial layer and laterally spaced apart from the source region, the P-sub region including a third well of the first conductive type and being connected to a P-sub electrode;
a deep well of the second conductive type, disposed in the epitaxial layer, the deep well radially extending from the first well through the second well to circumscribe the drain region and the source region;
a first metal wiring positioned over the first gate electrode, the first metal wiring being connected to the drain electrode and the P-sub electrode; and
a second metal wiring positioned over the first metal wiring, the second metal wiring being connected to the source electrode.

2. The lateral double diffused MOS transistor of claim 1, wherein the drain region has a bar shape in a plan view.

3. The lateral double diffused MOS transistor of claim 1, wherein the deep well includes an overlapped region arranged to overlap both the source region and the drain region, and an extension region horizontally extending from a side portion of the overlapped region toward to the P-sub region.

4. The lateral double diffused MOS transistor of claim 1, wherein the first metal wiring includes a first RESURF portion overlapping the first gate electrode and the second metal wiring in a plan view, the first RESURF portion being connected to the second metal wiring.

5. The lateral double diffused MOS transistor of claim 1, further comprising a second gate electrode disposed on the epitaxial layer and between the source region and the P-sub region, the second gate electrode being partially overlapped with the source region.

6. The lateral double diffused MOS transistor of claim 5, wherein the first metal wiring further includes a second RESURF portion being overlapped with the second gate electrode and the second metal wiring in a plan view, the second RESURF portion being connected to the second metal wiring.

7. The lateral double diffused MOS transistor of claim 1, wherein a plurality of source electrodes is arranged along the source region, and the deep well includes a plurality of cut-off regions disposed at positions to correspond to the source electrodes.

8. The lateral double diffused MOS transistor of claim 1, wherein the deep well has a lateral width measured from a side end of the second well larger than a vertical depth measured from a lower end of the second well.

9. The lateral double diffused MOS transistor of claim 1, wherein the P-sub region has a ring shape to entirely surround the source region.

10. The lateral double diffused MOS transistor of claim 1, wherein the drain region includes a first high concentration region, the source region includes a second high concentration, and the P-sub region includes a third high concentration region.

11. The lateral double diffused MOS transistor of claim 10, wherein the second high concentration impurity region includes a first subsidiary high concentration impurity region and second and third subsidiary high concentration impurity region positioned at both side of the first subsidiary high concentration impurity region.

* * * * *